United States Patent
He et al.

(10) Patent No.: US 10,724,906 B1
(45) Date of Patent: Jul. 28, 2020

(54) NON-CONTACT REAL-TIME STRESS MONITORING METHOD FOR BURIED PIPELINE

(71) Applicant: Southwest Petroleum University, Chengdu, Sichuan Province (CN)

(72) Inventors: Guoxi He, Chengdu (CN); Tengjiao He, Chengdu (CN); Kexi Liao, Chengdu (CN); Jianhua Zhao, Chengdu (CN); Shuting Yang, Chengdu (CN)

(*) Notice: Subject to any disclaimer, the term of this patent is extended or adjusted under 35 U.S.C. 154(b) by 0 days.

(21) Appl. No.: 16/681,820

(22) Filed: Nov. 13, 2019

(30) Foreign Application Priority Data

Jun. 21, 2019 (CN) .......................... 2019 1 0541665

(51) Int. Cl.
*G01L 1/12* (2006.01)
*G01R 33/09* (2006.01)
*G01R 33/02* (2006.01)

(52) U.S. Cl.
CPC ............ *G01L 1/12* (2013.01); *G01R 33/0206* (2013.01); *G01R 33/09* (2013.01)

(58) Field of Classification Search
CPC ........ G01L 1/12; G01R 33/0206; G01R 33/09
See application file for complete search history.

(56) References Cited

U.S. PATENT DOCUMENTS

2017/0122909 A1* 5/2017 Goroshevskiy ..... G01M 5/0025

* cited by examiner

*Primary Examiner* — Alexander Satanovsky
*Assistant Examiner* — Mark I Crohn

(57) ABSTRACT

A non-contact real-time stress monitoring method for buried pipeline and a device thereof are provided. The method includes the following steps: Step S10: selecting pipelines with the same material, pipe diameter and wall thickness as the buried pipeline being monitored for lift-off effect test, and obtaining a plurality of sets of lift-off magnetic field gradient modulus under a plurality of sets of lift-off heights; Step S20: using MATLAB to fit the G1-h relationship curve for obtaining the values of parameters a1, b1, a2, and b2 in a quantitative relationship formula containing the lift-off gradient modulus and the lift-off height; Step S30: placing a non-contact monitoring device directly above the buried pipeline being monitored to obtain a magnetic field gradient modulus of the buried pipeline; and Step S40: calculating an absolute value of real-time stress of the buried pipeline according to the magnetic field gradient modulus of the buried pipeline.

5 Claims, 7 Drawing Sheets

NON-CONTACT REAL-TIME STRESS MONITORING METHOD FOR BURIED PIPELINE

BACKGROUND OF THE INVENTION

Field of the Invention

The present invention relates to a non-contact real-time stress monitoring method for buried pipeline and a non-contact real-time stress monitoring device for buried pipeline thereof, which belongs to the field of stress monitoring for buried pipeline.

Description of Related Art

At present, the most widely-used monitoring method for buried pipelines is stress-strain gauge monitoring. As shown in FIG. 1, the commonly-used strain gauge is composed of a laminated film, a metal resistor sheet and a plastic film. The strain gauge is adhered to a pipeline to be monitored for detecting changes in the stress of the pipeline by measuring changes in the resistance of the metal resistor sheet, thereby achieving monitoring of the stress of the pipeline.

The existed monitoring method has the following drawbacks:

(1) according to the principle of the stress-strain gauge, the stress-strain gauge monitoring cannot obtain an initial stress value ao of the pipeline to be monitored, and it mainly responds to the changes in the stress caused by pressure and load, so that the true stress state of the pipeline cannot be reflected, and the safety state of the pipeline cannot be determined;

(2) the stress-strain gauge monitoring technology employs a contact monitoring mode, so that the buried pipeline being monitored must be excavated, causing a limitation on the application in a complex geological environment, and an increase of difficulty in installation and cost.

SUMMARY OF THE INVENTION

In order to overcome the drawbacks of the prior art, it is an object of the present invention to provide a non-contact real-time stress monitoring method for buried pipeline and a non-contact real-time stress monitoring device for buried pipeline. The method and device can overcome the problem of only reflection of pipeline's stress changes by the stress-strain gauge and on-site installation restrictions for contact monitoring device, so that failure and fracture accidents under the action of excessive load and stress on the pipeline may be avoided.

According to an exemplary embodiment, a non-contact real-time stress monitoring method for buried pipeline is provided.

The method includes the following steps:

Step S10: selecting a target pipeline having the same material, pipe diameter and wall thickness as a buried pipeline being monitored for lift-off effect test, and obtaining a plurality of sets of lift-off magnetic field gradient modulus $G_1$ under a plurality of sets of lift-off heights h;

Step S20: using MATLAB to fit a $G_1$-h relationship curve for obtaining values of parameters $a_1$, $b_1$, $a_2$, and $b_2$ in a quantitative relationship formula containing the lift-off magnetic field gradient modulus $G_1$ and the lift-off height h; the quantitative relationship formula is:

$$G_1 = a_1 \cdot e^{b_1 h} + a_2 \cdot e^{b_2 h};$$

wherein $G_1$ is the lift-off magnetic field gradient modulus; h is the lift-off height; and $a_1$, $b_1$, $a_2$, and $b_2$ are parameters, respectively;

Step S30: placing a non-contact monitoring device directly above the buried pipeline being monitored to obtain a magnetic field gradient modulus G of the buried pipeline being monitored; and Step S40: calculating a real-time stress σ of the buried pipeline being monitored according to the obtained magnetic field gradient modulus G of the buried pipeline being monitored, the calculating formula is:

$$\sigma = -0.07\sigma_s \ln\left[0.001\left(\frac{6.32\beta}{\frac{G}{DQ} - 1} - 1\right)\right];$$

$$\beta = \frac{a_1 \cdot e^{b_1 h_1} + a_2 \cdot e^{b_2 h_1}}{a_1 \cdot e^{b_1 h_0} + a_2 \cdot e^{b_2 h_0}};$$

wherein σ is the absolute value of stress; σs is a yield strength of the buried pipeline being monitored; β is a magnetic signal transform coefficient related to the buried depth of the pipeline; DQ is a gradient modulus of a background magnetic field of the buried pipeline being monitored; $h_1$ refers to a buried depth of the buried pipeline being monitored; $h_0$ is a standard height with a value of 1 m; and $a_1$, $b_1$, $a_2$, and $b_2$ are parameters respectively.

In one embodiment, the non-contact monitoring device includes a non-contact stress monitor, a data collector connected to the non-contact stress monitor through a communication extension line, an industrial router connected to the data collector through a network cable, an inverter controller, a battery, a power controller, and a solar panel connected to the power controller through a power cord, wherein the data collector and the industrial router are respectively connected to the inverter controller, the inverter controller and the battery are connected in parallel to the power controller through a second power cord, and both ends of the non-contact stress monitor are respectively provided with a three-axis magneto-resistive sensor.

In one embodiment, the three-axis magneto-resistive sensor is a three-axis AMR (anisotropic magnetoresistance) sensor, and the three-axis AMR sensor includes a Wheatstone bridge, an operational amplifier, a filter, an analog-to-digital converter and a USB to SPI bridge chip that are electrically connected in sequence.

In one embodiment, the non-contact stress monitor is perpendicular to the buried pipeline being monitored.

In one embodiment, in the step S10, the lift-off magnetic field gradient modulus $G_1$ of the buried pipeline being monitored is measured by a non-contact stress monitor of the non-contact monitoring device.

In one embodiment, the lift-off height h is a height between the non-contact stress monitor and a center of the pipeline.

In one embodiment, the non-contact real-time stress monitoring method for buried pipeline further includes the following steps: calculating a stress risk coefficient SDC according to the absolute value of real-time stress σ obtained in the above step S40 with a formula as follows:

$$SDC = -0.6245 \ln\left(\frac{\sigma}{\sigma_s}\right) + 1.5;$$

and determining a current monitoring condition of the buried pipeline being monitored according to the stress risk coefficient SDC, and providing an early warning.

According to another exemplary embodiment, a non-contact real-time stress monitoring device for buried pipeline is provided.

The non-contact real-time stress monitoring device includes a non-contact stress monitor, a data collector connected to the non-contact stress monitor through a communication extension line, an industrial router connected to the data collector through a network cable, an inverter controller, a battery, and a power controller, and a solar panel connected to the power controller through a power cord, wherein the data collector and the industrial router are respectively connected to the inverter controller, the inverter controller and the battery are connected in parallel to the power controller through a second power cord, and both ends of the non-contact stress monitor are respectively provided with a three-axis magneto-resistive sensor. The non-contact monitoring device is directly placed above a buried pipeline, such that the non-contact stress monitor is configured to obtain a magnetic field gradient modulus G of the buried pipeline being monitored. When a target pipeline having the same material, pipe diameter and wall thickness is selected as the buried pipeline being monitored for lift-off effect test, the non-contact monitor is further configured to obtain a plurality of sets of lift-off magnetic field gradient modulus $G_1$ under a plurality of sets of lift-off heights h, and the lift-off height h is a height between the monitor and a center of the pipeline.

In one embodiment, the non-contact real-time stress monitoring device for buried pipeline further includes a risk coefficient calculating module and a risk determining module. The risk coefficient calculating module is configured to calculate a stress risk coefficient SDC according to the absolute value of real-time stress σ obtained in the above step S40 with a formula as follows:

$$SDC = -0.6245\ln\left(\frac{\sigma}{\sigma_s}\right) + 1.5.$$

The monitoring condition determining module is configured to determine a current monitoring condition of the buried pipeline being monitored according to the stress risk coefficient SDC, and providing an early warning.

The present invention has the following advantages:

(1) Based on the force-magnetic quantitative relationship of the ferromagnetic material, the magnetic field gradient modulus of the pipeline obtained by monitoring is converted into the stress of the pipeline, thereby achieving the monitoring of the current true stress condition of the pipeline.

(2) The risk degree of stress concentration in the pipeline is characterized based on the calculation model of the stress risk coefficient SDC, and classified monitoring states are set, so as to achieve urgent early warning in case of excessive stress.

(3) The non-contact real-time stress monitoring and early warning system adopts ground installation method, which saves excavation installation costs and lowers maintenance costs when repairing sensors as compared with the contact strain gauge monitoring.

BRIEF DESCRIPTION OF THE DRAWINGS

Aspects of the present invention are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE INVENTNION

Figure 1:
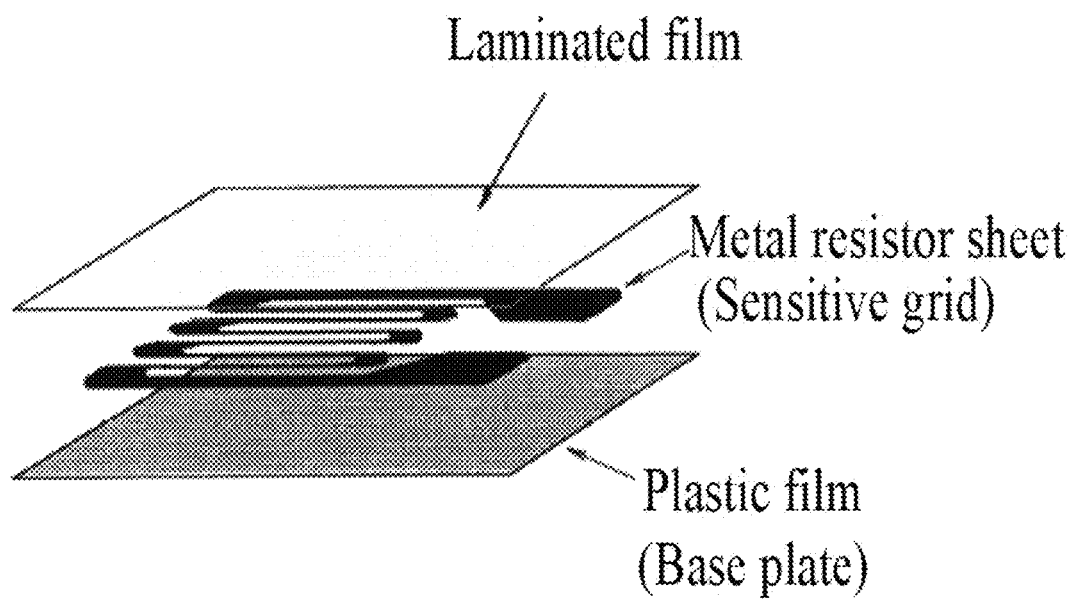
FIG. 1 is a composition diagram of a commonly-used strain gauge in the prior art.

The following invention provides many different embodiments, or examples, for implementing different features of the provided subject matter. Specific examples of components and arrangements are described below to simplify the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 7:
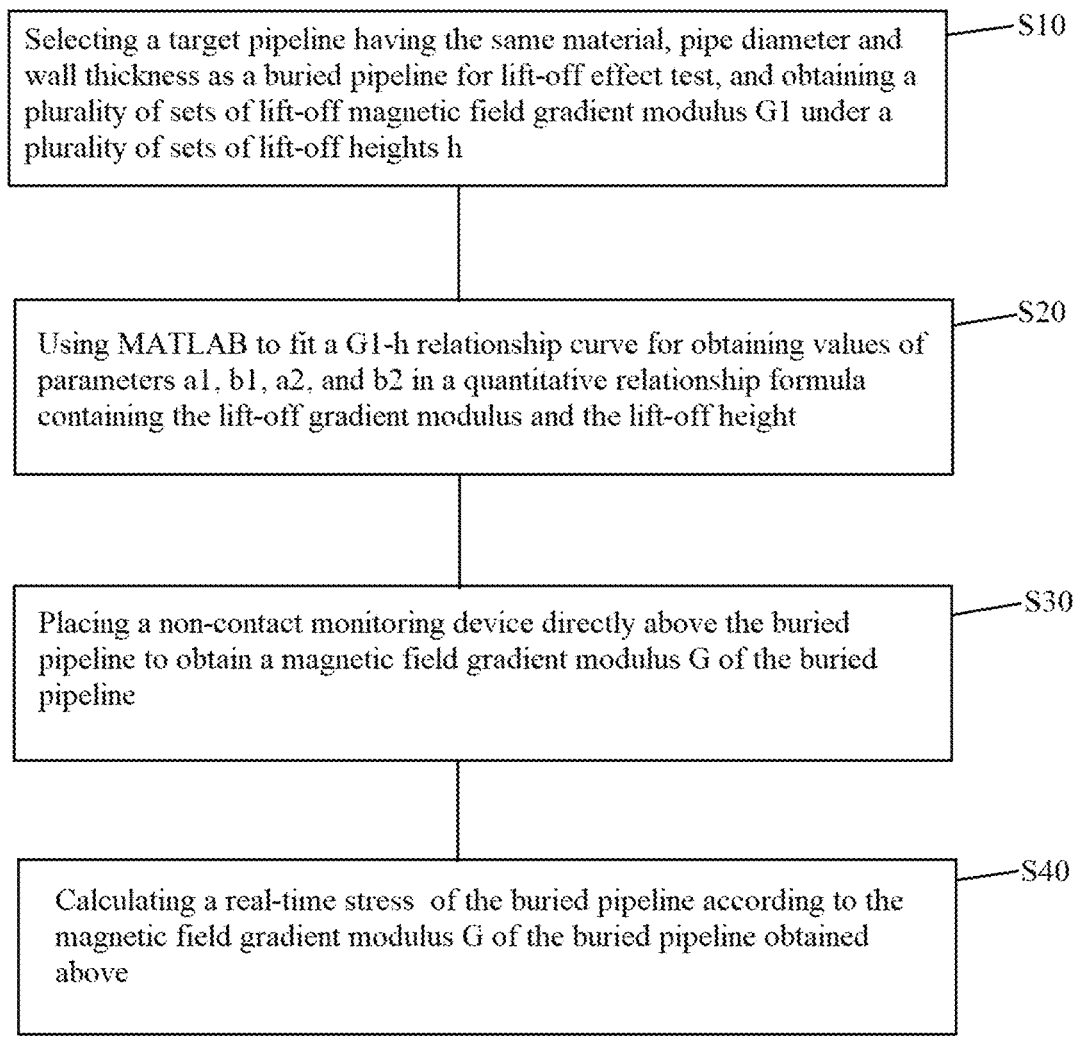
FIG. 7 is a flowchart of a non-contact real-time stress monitoring method for buried pipeline according to an embodiment of the present invention.

Please refer to FIG. 7. FIG. 7 is a flowchart of a non-contact real-time stress monitoring method for buried pipeline according to an embodiment of the present invention.

Figure 2:
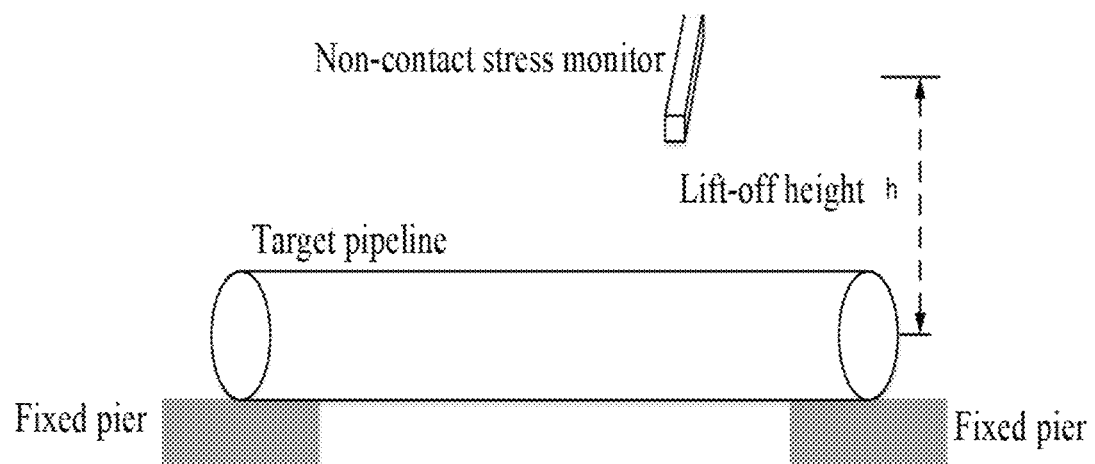
FIG. 2 is an experimental diagram of the lift-off effect test.

The non-contact real-time stress monitoring method for buried pipeline of the present invention includes steps of:

Step S10: (as shown in FIG. 2) selecting a target pipeline having the same material, pipe diameter and wall thickness as a buried pipeline being monitored for lift-off effect test, and obtaining a plurality of sets of lift-off magnetic field gradient modulus $G_1$ under a plurality of sets of lift-off heights h;

Step S20: using MATLAB to fit a $G_1$-h relationship curve for obtaining values of parameters $a_1$, $b_1$, $a_2$, and $b_2$ in a quantitative relationship formula containing the lift-off magnetic field gradient modulus $G_1$ and the lift-off height h; the quantitative relationship formula is:

$$G_1 = a_1 \cdot e^{b_1 h} + a_2 \cdot e^{b_2 h};$$

wherein $G_1$ is the lift-off magnetic field gradient modulus; h is the lift-off height; and $a_1$, $b_1$, $a_2$, and $b_2$ are parameters, respectively.

The above method is used to test a steel pipe with a material of L360 and a pipe size of Φ508×9 mm, thus $a_1$, $b_1$, $a_2$, and $b_2$ are obtained as 15170, 12.73, −1.01, 0.686 respectively. That is, the quantitative relationship formula of the transformation coefficient β is:

$$\beta = \frac{1.517 \times 10^4 \cdot e^{-1.01h_1} + 12.73 \cdot e^{0.686h_1}}{1.517 \times 10^4 \cdot e^{-1.01} + 12.73 \cdot e^{0.686}}.$$

Figure 3:
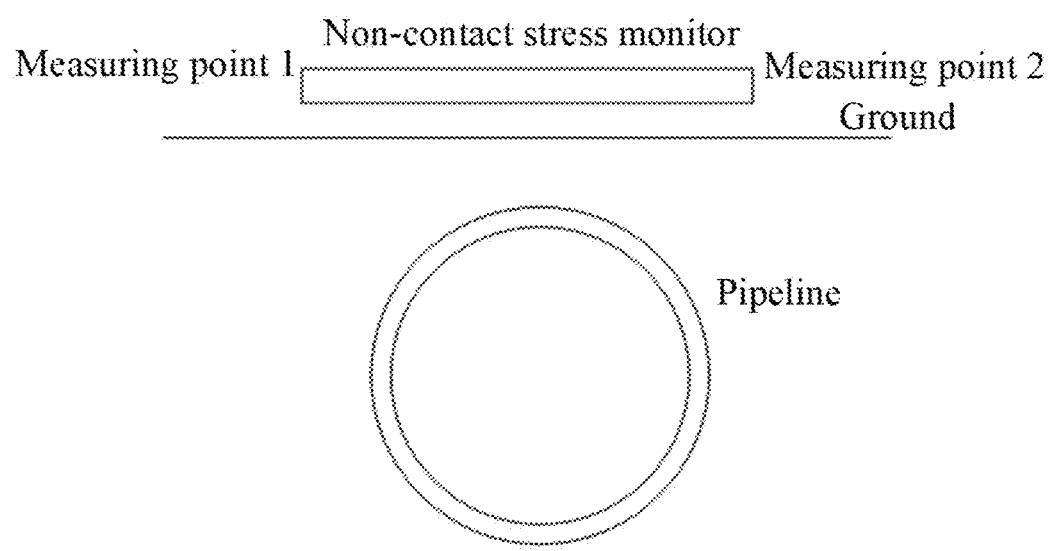
FIG. 3 is a diagram showing a non-contact monitoring device placed on a buried pipeline.

Step S30: (as shown in FIG. 3) placing a non-contact monitoring device directly above the buried pipeline being monitored to obtain a magnetic field gradient modulus G of the buried pipeline being monitored.

Figure 4:
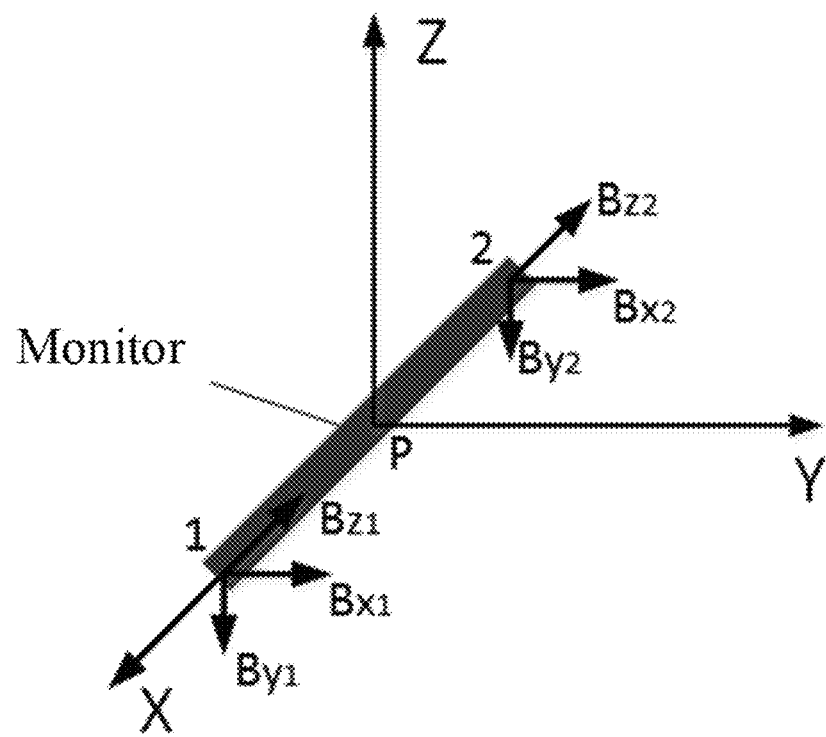
FIG. 4 is a diagram showing three axial-components of a magnetic flux density acquired by a non-contact monitoring device.

Specifically, as shown in FIG. 4, collecting three axial-components $B_x$, $B_y$ and $B_z$ of the magnetic flux density of two measuring points on both sides of the same pipeline section, wherein the X direction is a radial horizontal direction of the pipeline, the Y direction is an axial direction of the pipeline, and the Z direction is a vertical direction of the pipeline.

Then, calculating the following formula to obtain gradients $$\frac{\partial B_x}{\partial X}, \frac{\partial B_y}{\partial X}, \frac{\partial B_z}{\partial X}$$

of the three axial-components of the magnetic flux density of the pipeline section along a direction perpendicular to the axial direction of the pipe line (X direction) and the magnetic field gradient modulus G;

$$G = \sqrt{\left(\frac{\partial B_x}{\partial X}\right)^2 + \left(\frac{\partial B_y}{\partial X}\right)^2 + \left(\frac{\partial B_z}{\partial X}\right)^2};$$

$$\frac{\partial B_i}{\partial X} = \frac{B_{i1} - B_{i2}}{l};$$

wherein i is x, y, z directions of the magnetic flux density, $B_{i1}$ is the magnetic flux density of First sensor in the i direction, $B_{i2}$ is the magnetic flux density of Second sensor in the i direction, l is the length of the monitoring device.

Step S40: calculating an absolute value of real-time stress σ of the buried pipeline being monitored according to the obtained magnetic field gradient modulus G of the buried pipeline being monitored, the calculating formula is:

$$\sigma = -0.07\sigma_s \ln\left[0.001\left(\frac{6.32\beta}{\frac{G}{DQ} - 1} - 1\right)\right];$$

$$\beta = \frac{a_1 \cdot e^{b_1 h_1} + a_2 \cdot e^{b_2 h_1}}{a_1 \cdot e^{b_1 h_0} + a_2 \cdot e^{b_2 h_0}};$$

wherein σ is an absolute value of real-time stress; $\sigma_s$ is a yield strength of the buried pipeline being monitored; β is a magnetic signal transform coefficient related to the buried depth of the pipeline; DQ is a gradient modulus of a background magnetic field of the buried pipeline being monitored; $h_1$ refers to a buried depth of the buried pipeline being monitored; $h_0$ is a standard height with a value of 1 m; and $a_1$, $b_1$, $a_2$, and $b_2$ are parameters, respectively. Among them, the gradient modulus DQ of the background magnetic field of the buried pipeline being monitored obtains the background magnetic field at the location of the buried pipeline being monitored by the non-contact monitoring device.

Among them, the above step S40 obtains the absolute value of real-time stress σ corresponding to each real-time magnetic field gradient modulus G, wherein during the monitoring, an early warning for risk conditions may be performed on the basis of the embodiment of the present invention, specifically including:

first, calculating a stress risk coefficient SDC according to the absolute value of real-time stress σ obtained in the above step S40 with a formula as follows:

$$SDC = -0.6245\ln\left(\frac{\sigma}{\sigma_s}\right) + 1.5;$$

then, determining a current monitoring condition of the buried pipeline being monitored according to the stress risk coefficient SDC, and providing the early warning, wherein the monitoring state of the pipeline is classified as shown in Table 1.

TABLE 1

| Classified monitoring states | | |
| --- | --- | --- |
| SDC value | Safety state | Monitoring state |
| (0, 0.2] | High risk | Urgent early warning |
| (0.2, 0.6] | Moderate risk | Key monitoring |
| (0.6, 1) | Low risk | Normal operation |

Figure 5:
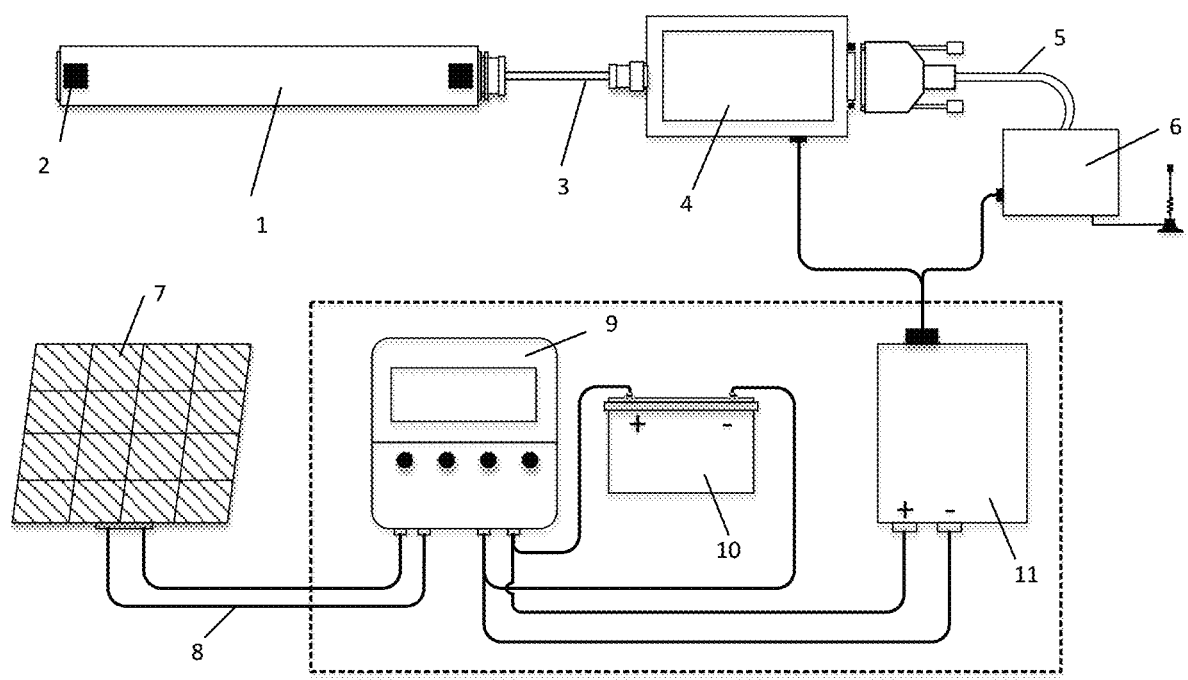
FIG. 5 is a structural diagram of a non-contact monitoring device according to an embodiment of the present invention.

As shown in FIG. 5, the non-contact monitoring device includes a non-contact stress monitor 1, a data collector 4 connected to the non-contact stress monitor 1 through a communication extension line 3, an industrial router 6 connected to the data collector 4 through a network cable 5, an inverter controller 11, a battery 10, and a power controller 9, and a solar panel 7 connected to the power controller 9 through a power cord 8, wherein the data collector 4 and the industrial router 6 are respectively connected to the inverter controller 11, the inverter controller 11 and the battery 10 are connected in parallel to the power controller 9 through a power cord, and both ends of the non-contact stress monitor 1 are respectively provided with a three-axis magneto-resistive sensor 2.

The process of the monitoring device is as follows: as shown in FIG. 3, the non-contact stress monitor 1 is placed directly above the buried pipeline being monitored in the horizontal radial direction of the pipeline; the first sensor and the second sensor at both ends of the non-contact stress monitor 1 respectively collect the three axial-components of the magnetic flux density of the two measuring points on both sides of the buried pipeline being monitored; the collected three axial-components of the magnetic flux density are transmitted to the data collector 4; and a magnetic gradient modulus is obtained through a calculation module of the data collector 4.

In one embodiment, the non-contact monitoring device may further includes a risk calculating module and a risk coefficient determining module (not shown). The risk calculating module is configured to calculate a stress risk coefficient SDC according to the absolute value of real-time stress σ obtained in the above step S40 with a formula as follows:

$$SDC = -0.6245\ln\left(\frac{\sigma}{\sigma_s}\right) + 1.5.$$

The monitoring condition determining module is configured to determine a current monitoring condition of the buried pipeline being monitored according to the stress risk coefficient SDC, and to provide an early warning.

Figure 6:
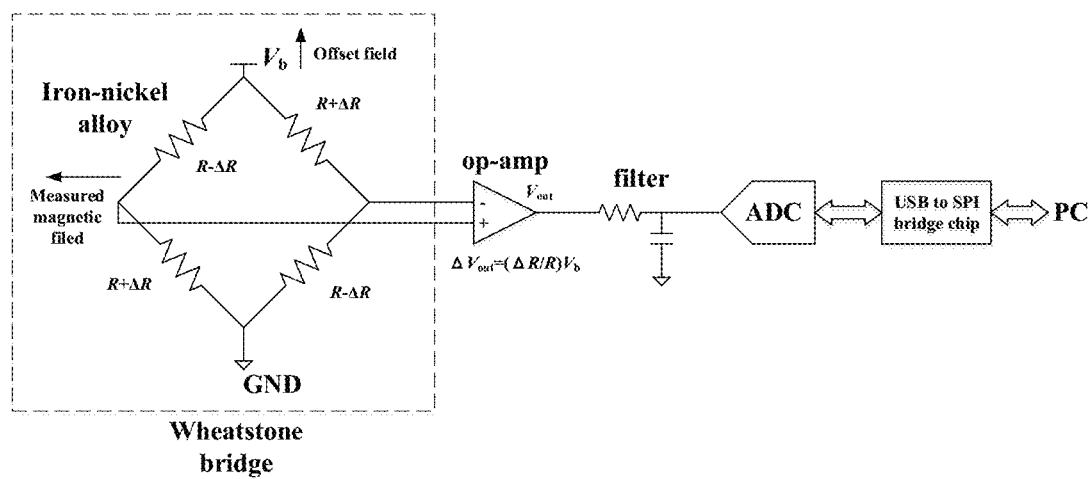
FIG. 6 is a circuit principle diagram of a three-axis AMR (anisotropic magnetoresistance) sensor.

As shown in FIG. 6, the three-axis magneto-resistive sensor is a three-axis AMR sensor, and the three-axis AMR sensor includes a Wheatstone bridge, an operational amplifier, a filter, an analog-to-digital converter and a USB to SPI bridge chip that are electrically connected in sequence. The Wheatstone bridge is used to convert the magnetic signal of the measured pipeline into a voltage signal, the operational amplifier amplifies the voltage signal and increases the output voltage, the filter is used to filter out high frequency noise in the voltage signal, the analog-to-digital converter converts the input voltage signal into an output digital signal, and then, the digital signal is externally transmitted to the data collector 4 by bridging the analog to digital converter with the data collector 4 via a USB to SPI bridge chip.

Among them, for the monitoring tasks of buried pipelines, especially long-distance pipelines, the on-site power supply conditions are poor under normal circumstances, and 220V AC power may not be provided, so the solar energy system is used to supply power to the monitoring device.

The solar system is mainly composed of a solar panel 7, a power controller 9, a battery 10, and an inverter controller 11. Its working process is as follows:

A current generated by the sunlight illuminating the solar panel 7 charges the battery 10 through the power controller 9, and the electric energy of the battery 10 is converted, by the inverter controller 11, into the AC 220V alternating current to be used by the monitoring device.

The battery 10 has a power reservation function, and the electricity is gradually accumulated in the presence of light. When the solar panel 7 can not charge the battery in the rainy day, the stored electricity of the battery 10 can be used for the system to continue to work, so that the power can be stably supplied.

Under long-term continuous rainy weather conditions (5 days and above), solar power generation is insufficient, causing the voltage of the battery 10 to drop continuously; when the voltage of the battery 10 is lower than a set threshold, the power supply system turns off the load output function to protect the battery. When the voltage of the battery 10 rises to the set value, the power supply system automatically restores the power supply.

The above embodiment of the present invention has the following advantages:

(1) Based on the force-magnetic quantitative relationship of the ferromagnetic material, the magnetic field gradient modulus of the pipeline obtained by monitoring is converted into the stress of the pipeline, thereby achieving the monitoring of the current true stress condition of the pipeline.

(2) The risk degree of stress concentration in the pipeline is characterized based on the calculation model of the stress risk coefficient SDC, and classified monitoring states are set, so as to achieve urgent early warning in case of excessive stress.

(3) The non-contact real-time stress monitoring and early warning system adopts ground installation method, which saves excavation installation costs and lowers maintenance costs when repairing sensors as compared with the contact strain gauge monitoring.

(4) The whole monitoring device adopts modular design, and only the failed module has to be repaired when the failure occurs, which greatly improves the system maintenance efficiency while adding different functional modules according to user's requirements.

(5) The three-axis AMR sensor uses permalloy as the resistance material for the Wheatstone bridge, which the advantages of high precision, small volume and good stability, and only one layer of magnetic film is needed for the process, causing the process to be simple, the cost to be low, no requirement for expensive manufacturing apparatus, so as to be suitable for mass production and more catering to the needs of the consumer electronics market.

The foregoing outlines features of several embodiments so that those skilled in the art may better understand the aspects of the present invention. Those skilled in the art should appreciate that they may readily use the present invention as a basis for designing or modifying other processes and structures for carrying out the same purposes and/or achieving the same advantages of the embodiments introduced herein. Those skilled in the art should also realize that such equivalent constructions do not depart from the spirit and scope of the present invention, and that they may make various changes, substitutions, and alterations herein without departing from the spirit and scope of the present invention.

What is claimed is:

1. A non-contact real-time stress monitoring method for buried pipeline, comprising:

Step S10: selecting a target pipeline having the same material, pipe diameter and wall thickness as a buried pipeline being monitored for lift-off effect test, and obtaining a plurality of sets of lift-off magnetic field gradient modulus $G_1$ under a plurality of sets of lift-off heights h;

Step S20: using MATLAB to fit a $G_1$-h relationship curve for obtaining values of parameters $a_1$, $b_2$, and $b_2$ in a quantitative relationship formula containing the lift-off magnetic field gradient modulus $G_1$ and the lift-off height h; the quantitative relationship formula is:

$$G_1 = a_1 \cdot e^{b_1 h} + a_2 \cdot e^{b_2 h};$$

wherein $G_1$ is the lift-off magnetic field gradient modulus, h is the lift-off height, $a_1$, $b_1$, $a_2$, and $b_2$ are parameters, respectively;

Step S30: placing a non-contact monitoring device directly above the buried pipeline being monitored to obtain a magnetic field gradient modulus G of the buried pipeline being monitored, wherein the non-contact monitoring device comprises a non-contact stress monitor, a data collector connected to the non-contact stress monitor through a communication extension line, an industrial router connected to the data collector through a network cable, an inverter controller, a battery, and a power controller, and a solar panel connected to the power controller through a power cord, wherein the data collector and the industrial router are respectively connected to the inverter controller, the controller and the battery are connected in parallel to the power controller through a second power cord, and both ends of the non-contact stress monitor are respectively provided with a three-axis magneto-resistive sensor;

Step S40: calculating an absolute value of real-time stress $\sigma$ of the buried pipeline being monitored according to the obtained magnetic field gradient modulus G of the buried pipeline being monitored, the calculating formula is:

$$\sigma = -0.07\sigma_s \ln\left[0.001\left(\frac{6.32\beta}{\frac{G}{DQ}-1}-1\right)\right];$$

$$\beta = \frac{a_1 \cdot e^{b_1 h_1} + a_2 \cdot e^{b_2 h_1}}{a_1 \cdot e^{b_1 h_0} + a_2 \cdot e^{b_2 h_0}};$$

wherein $\sigma$ is an absolute value of real-time stress; $\sigma s$ is a yield strength of the buried pipeline being monitored; $\beta$ is a magnetic signal transform coefficient related to a buried depth of the pipeline; DQ is a gradient modulus of a background magnetic field of the buried pipeline being monitored; $h_1$ refers to a buried depth of the buried pipeline being monitored; $h_0$ is a standard height with a value of 1 m; and $a_1$, $b_1$, $a_2$, and $b_2$ are parameters respectively.

2. The non-contact real-time stress monitoring method for buried pipeline according to claim 1, wherein the three-axis magneto-resistive sensor is a three-axis AMR (anisotropic magnetoresistance) sensor, and the three-axis AMR sensor comprises a Wheatstone bridge, an operational amplifier, a filter, an analog-to-digital converter and a USB to SPI bridge chip that are electrically connected in sequence.

3. The non-contact real-time stress monitoring method for buried pipeline according to claim 1, wherein the non-contact stress monitor is perpendicular to the buried pipeline being monitored.

4. The non-contact real-time stress monitoring method for buried pipeline according to claim 1, wherein in the step S10, the lift-off magnetic field gradient modulus $G_1$ of the buried pipeline being monitored is measured by a non-contact stress monitor of the non-contact monitoring device.

5. The non-contact real-time stress monitoring method for buried pipeline according to claim 4, wherein the lift-off height h is a height between the non-contact stress monitor and a center of the pipeline.

* * * * *